US 6,690,066 B1

(12) United States Patent
Lin et al.

(10) Patent No.: US 6,690,066 B1
(45) Date of Patent: Feb. 10, 2004

(54) MINIMIZATION AND LINEARIZATION OF ESD PARASITIC CAPACITANCE IN INTEGRATED CIRCUITS

(75) Inventors: Heng-Chih Lin, Plano, TX (US); Charvaka Duvvury, Plano, TX (US); Baher Haroun, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/274,163

(22) Filed: Oct. 18, 2002

(51) Int. Cl.[7] .............................................. H01L 23/62
(52) U.S. Cl. ...................................................... 257/355
(58) Field of Search ................................ 257/288, 355, 257/356, 357, 358, 359, 360, 361, 362, 363

(56) References Cited

U.S. PATENT DOCUMENTS 5,751,507 A * 5/1998 Watt et al.

2002/0109189 A1 * 8/2002 Chen et al.

* cited by examiner

Primary Examiner—Nathan J. Flynn
Assistant Examiner—Kevin Quinto
(74) Attorney, Agent, or Firm—J. Dennis Moore; W. James Brady, III; Frederick J. Telecky, Jr.

(57) ABSTRACT

An integrated circuit protecting an I/O pad 303 against an ESD pulse, the circuit having in the same substrate a discharge sub-circuit 301 and a drive sub-circuit 302, each sub-circuit including an MOS transistor. The circuit comprises a direct connection between the I/O pad 303 and the drain 321 of the drive sub-circuit MOS transistor 306, and further a forward diode 360 inserted between the I/O pad 303 and the drain 311 of the discharge sub-circuit MOS transistor 305 to isolate the junction capacitance of the discharge sub-circuit MOS transistor, whereby electrical noise coupling to the substrate is reduced, RF/analog input signals are improved, and leakage at the I/O pad is reduced.

12 Claims, 3 Drawing Sheets

MINIMIZATION AND LINEARIZATION OF ESD PARASITIC CAPACITANCE IN INTEGRATED CIRCUITS

FIELD OF THE INVENTION

The present invention is related in general to the field of electronic systems and semiconductor devices and more specifically to the field of electrostatic discharge (ESD) protection in high speed, high precision analog and mixed-signal applications, especially for fail-safe circuits.

DESCRIPTION OF THE RELATED ART

Integrated circuits (ICs) may be severely damaged by electrostatic discharge (ESD) events. A major source of ESD exposure to ICs is from the charged human body (described by the "Human Body Model", HBM); the discharge of the human body generates peak currents of several amperes to the IC for about 100 ns. A second source of ESD is from metallic objects (described by the Machine model", MM); it can generate transients with significantly higher current levels than the HBM ESD source. A third source is described by the "charged device model" (CDM), in which the IC itself becomes charged and discharges to ground in the opposite direction than the HBM and MM ESD sources (and in less than 500 ps). More detail on ESD phenomena and approaches for protection in ICs can be found in A. Amerasekera and C. Duvvury, "ESD in Silicon Integrated Circuits" ($2^{nd}$ edition, John Wiley & Sons LTD. London, 2002), and C. Duvvury, "ESD: Design for IC Chip Quality and Reliability" (Int. Symp. Quality in El. Designs, 2000, pp. 251–259; ref. of recent literature).

ESD phenomena in ICs are growing in importance as the demand for higher operating speed, smaller operating voltages, higher packing density and reduced cost drives a reduction of all device dimensions. This generally implies thinner dielectric layers, higher doping levels with more abrupt doping transitions, and higher electric fields—all factors that contribute to an increased sensitivity to damaging ESD events.

The most common protection schemes used in metal-oxide-semiconductor (MOS) ICs rely on the parasitic bipolar transistor associated with an nMOS device whose drain is connected to the pin to be protected and whose source is tied to ground. The protection level or failure threshold can be set by varying the nMOS device width from the drain to the source under the gate oxide of the nMOS device. Under stress conditions, the dominant current conduction path between the protected pin and ground involves the parasitic bipolar transistor operating in the snapback region under pin positive with respect to ground stress events.

The dominant failure mechanism, found in the nMOS protection device operating as a parasitic bipolar transistor in snapback conditions, is the onset of second breakdown. Second breakdown is a phenomenon that induces thermal runaway in the device wherever the reduction of the impact ionization current is offset by the thermal generation of carriers. Second breakdown is initiated in a device under stress as a result of self-heating. The peak nMOS device temperature, at which second breakdown is initiated, is known to increase with the stress current level.

Many circuits have been proposed and implemented for protecting ICs from ESD. One method is biasing the substrate of ESD protection circuits in an IC. Such substrate biasing can be effective in improving the response of a multi-finger MOS transistor which is used to conduct an ESD discharge to ground.

In the recent U.S. Pat. No. 5,940,258, issued Aug. 17, 1999 (Duvvury, "Semiconductor ESD Protection Circuit"), a substrate pump ESD protection bias technique has been described for standard epitaxial and non-epitaxial devices. This concept has been successfully applied to bulk CMOS technologies, including devices with thin epitaxial silicided features. The drive circuit in this technique, however, may have a relatively high and non-linear capacitance, and significant leakage current.

Economic needs drive the integration of analog, digital and RF circuits on the same chip with the same substrate. Substrate noise generated by digital circuitry couples to the RF/analog inputs through large, non-linear ESD parasitic capacitance and thus degrades the performance of analog circuitry. Furthermore, "hot insertion" requirement in today's electronic devices demands a fail-safe (i.e., no diode to Vdd) ESD design. How to achieve an ESD protection circuit with small and linear parasitic capacitance while maintaining a fail-safe feature, becomes a challenge for the ESD designer.

An urgent need has therefore arisen for a coherent, low-cost method of compact ESD protection devices compatible with fail-safe operation, linear analog circuits, especially high speed, high precision analog or mixed signal applications, and offering good noise immunity. The device structures should further provide excellent electrical performance, mechanical stability and high reliability. The fabrication method should be simple, yet flexible enough for different semiconductor product families and a wide spectrum of design and process variations, especially in CMOS technology. Preferably, these innovations should be accomplished without extending production cycle time, and using the installed equipment, so that no investment in new manufacturing machines is needed.

SUMMARY OF THE INVENTION

The invention discloses an integrated circuit protecting an I/O pad against an ESD pulse, wherein said circuit has in the same substrate a discharge sub-circuit and a drive sub-circuit; each sub-circuit includes an MOS transistor and comprises a direct connection between the I/O pad and the drain of the drive sub-circuit MOS transistor. The circuit further has a forward diode inserted between the I/O pad and the drain of the discharge sub-circuit MOS transistor to isolate the junction capacitance of the discharge sub-circuit MOS transistor. As a result, the electrical noise coupling to the substrate is reduced, the RF/analog input signals are improved, and the leakage at the I/O pad is (greatly) reduced.

The integrated circuit of the invention provides protection against one polarity of ESD stress by the connection of the I/O pad to the drain of the discharge sub-circuit MOS transistor, and concurrently against the opposite polarity of ESD stress by the connection to the anode of the forward diode.

The integrated circuit of the invention has a size correlation between the forward diode junction capacitance (which has a positive voltage coefficient) and the drive sub-circuit MOS transistor junction capacitance (which has a negative voltage coefficient). The combined capacitances are substantially constant with respect to the I/O pad voltage.

The integrated protection circuit of the invention has two accumulation capacitors, one of which is coupled between the I/O pad and the drive circuit MOS transistor, and the other is coupled between the diode and the drive circuit MOS transistor. Differential booting is thus provided to maintain uniform substrate bias.

It is a technical advantage of the present method of preventing ESD damage that it may be implemented using standard semiconductor processing techniques. The present ESD protection circuitry, therefore, does not add any processing time or expense to the IC.

The technical advances represented by the invention, as well as the aspects thereof, will become apparent from the following description of the preferred embodiments of the invention, when considered in conjunction with the accompanying drawings and the novel features set forth in the appended claims.

DETAILED DESCRIPTION OF THE PREFERRED EMBODIMENTS

The present invention is related to U.S. Pat. No. 5,940, 258, issued on Aug. 17, 1999 (Duvvury, "Semiconductor ESD Protection Circuit"), which is herewith incorporated by reference. The present invention is further related to U.S. patent application Ser. No. 10/146,158, filed on May 15, 2002 (Duvvury et al., "Substrate Pump ESD Protection for Silicon on Insulator Technologies"), and U.S. patent application Ser. No. 10/256,748, filed on Sep. 27, 2002, (Salling et al., "Diode-String Substrate-Pumped Electrostatic Discharge Protection"), which are herewith incorporated by reference.

Failsafe I/O circuits are traditionally defined as circuits on the bond pad that have no path for DC current regardless whether the device is powered "on" or "off". To create ESD protection under failsafe circuit condition is particularly important for multi-voltage systems that vary I/O operating voltage in order to conserve power.

An additional concern the I/O's should meet for their ESD protection is the amount of output capacitance seen at the bond pad. Since output capacitance restricts the overall bandwidth for bus solutions, I/O interfaces tend to be restrictive on allowable output capacitance. Providing solutions that have less capacitive loading will provide a more successful circuit design.

Another obvious concern is chip real estate area. Although tolerance to higher voltage is gained, drain-extended transistors tend to have lower I-drive compared to their standard transistor counterparts. This implies a disadvantage in the form of chip real estate. Area reduction needs to be leveraged off the intrinsic properties of the drain-extended devices themselves.

For ESD phenomena in drain-extended transistors, the use of an n-well under the drain in nMOS devices allows higher voltage tolerance, but this advantage is off-set by an inefficient lateral npn turn-on with high holding voltage. Consequently, the device ESD performance is poor because of the high power dissipation. Previously proposed improvements include the integration of an SCR (U.S. Pat. No. 5,903,032, issued May 11, 1999, Duvvury, "Power Device Integration for Built-in ESD Robustness"), the application of the gate coupling effect (C. Duvvury et al., "Efficient npn Operation in High Voltage nMOSFET for ESD Robustness", IEDM Digest, 1995), and an n+/p+ design (U.S. Pat. No. 4,939,616, issued Jul. 3, 1990, Rountree, "Circuit Structure with Enhanced Electrostatic Discharge Protection"). These improvements have become more challenging with the recent technical advances of shallow trench isolation (STI), low resistance substrate, and silicided diffusions.

The advantages of the present invention can best be appreciated by comparison with the shortcomings of the known technology.

Figure 1:
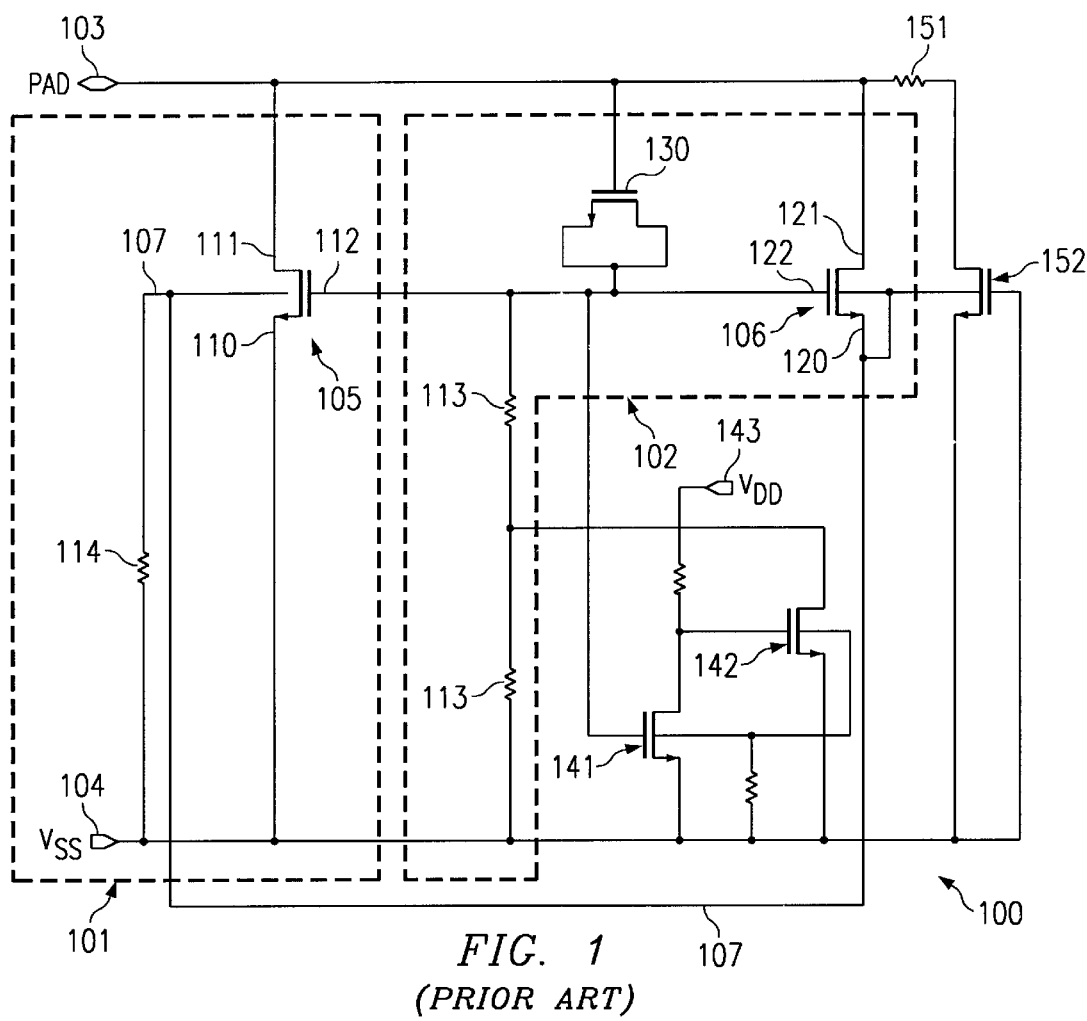
FIG. 1 is a schematic circuit diagram of an advanced fail-safe ESD protection circuit in known technology.

The fail-safe circuit of the known technology shown in FIG. 1 uses the advanced concept of substrate bias with a pump nMOS, described in the above-mentioned U.S. Pat. No. 5,940,258. The ESD protection circuit, generally designated 100, consists of a discharge circuit 101 to ground (Vss), and a substrate bias generator circuit 102 that uses a portion of the ESD pulse's energy to bias the substrate of the discharge circuit. The protection circuit 100 has an I/O or power pad 103, ground potential 104, an MOS transistor 105 in the discharge circuit 101, and an MOS transistor 106 in the bias generator 102.

Discharge circuit 101 has MOS transistor 105 designed as a multi-finger transistor. Its source 110 is connected to ground 104, its drain 111 is connected to input 103, and gates 112 are tied through resistor 113 to ground 104.

In the bias generator circuit 102, source 120 of transistor 106 is connected to body/substrate 107 and also to ground 104 through substrate resistor 114, drain 121 is connected to input 103, and gate 122 to gate 112 of transistor 105 and through resistor 113 to ground 104. The bias generator circuit 102 further includes capacitor 130.

The quoted patent applies to bulk CMOS technologies using standard epitaxial and non-epitaxial semiconductors. The patent introduces the concept of substrate pump ESD protection. When an ESD pulse with a large dV/dt is applied to the input node 103 of the ESD protection circuit, the large dV/dt causes a current I to flow through capacitor 130, having capacitance C, in accordance with the relationship $$I = C \cdot dV/dt.$$

This current causes the voltage at gates 112 and 122 to increase rapidly, turning on transistors 105 and 106. Transistor 105, designed as a multi-finger MOS transistor, may not instantly and simultaneously turn on all fingers as parasitic npn and thus may not act properly as a discharge transistor. In contrast, transistor 106 is designed as a single or multi-finger transistor and is fully turned on with MOS conduction by the voltage at gate 122 and thus conducts current from input 103 to ground 104 through resistor 114.

As current conducts to ground through resistor 114, substrate 107 rises to a predetermined maximum voltage.

This voltage rise subsequently causes also the substrate 107 of the ESD protection transistor 105 to rise. This rise, in turn, allows all of the multi-finger MOS transistor 105 to turn on as a bipolar device. Discharge device 101 then discharges the ESD pulse to ground 104.

ESD protection circuit 100 thus generates a substrate bias simultaneously with the occurrence of an ESD pulse and uses the energy of the ESD pulse to generate the substrate bias.

141 and 142 are control transistors to prevent accidental turn on of the gates 122 and 112 during normal operation, and to prevent pump from collapsing during ESD event if there is a charge buildup on Vdd ( 143) (transistors 141 and 142 provide a delay time for the protection circuit to respond before Vdd disables the pump). The secondary protection circuit ( 151 and 152) is necessary to protect the input CMOS gate for both HBM and CDM, making it an effective fail-safe circuit.

Figure 2:
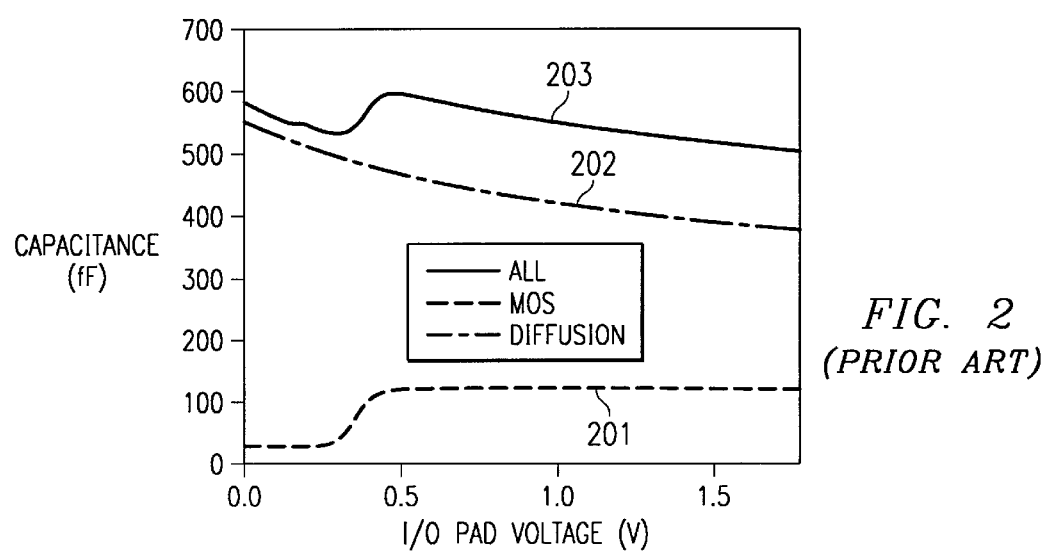
FIG. 2 shows the breakdown of ESD capacitance in the circuit of FIG. 1, illustrating the non-linearity of the MOS capacitance and the negative voltage coefficient of the diffusion capacitance of the drive circuit MOS transistor.

On the other hand, FIG. 2 illustrates the drawback of the large non-linear ESD capacitance 203. Plotted is the capacitance (measured in fF) as a function of the I/O pad voltage (measured in V). The wide transistor 105 contributes large and non-linear junction capacitance, and the MOS capacitor 130 contributes significant non-linear gate capacitance during normal operation (curve 201). Curve 202 originates form diffusion of transistors 105, 106, and 152. Combining both non-linear junction and gate capacitance, the overall ESD capacitance is quite large (about 600 fF in FIG. 2) and very non-linear (about 20% variation from 0 V to 1.8 V). This large non-linear ESD capacitance limits the use of the ESD protection circuit in high frequency RF or high resolution analog applications; it degrades the analog input linearity, through its voltage-dependent capacitance, but also picks up the substrate noise differentially even with differential input signals.

Figure 3:
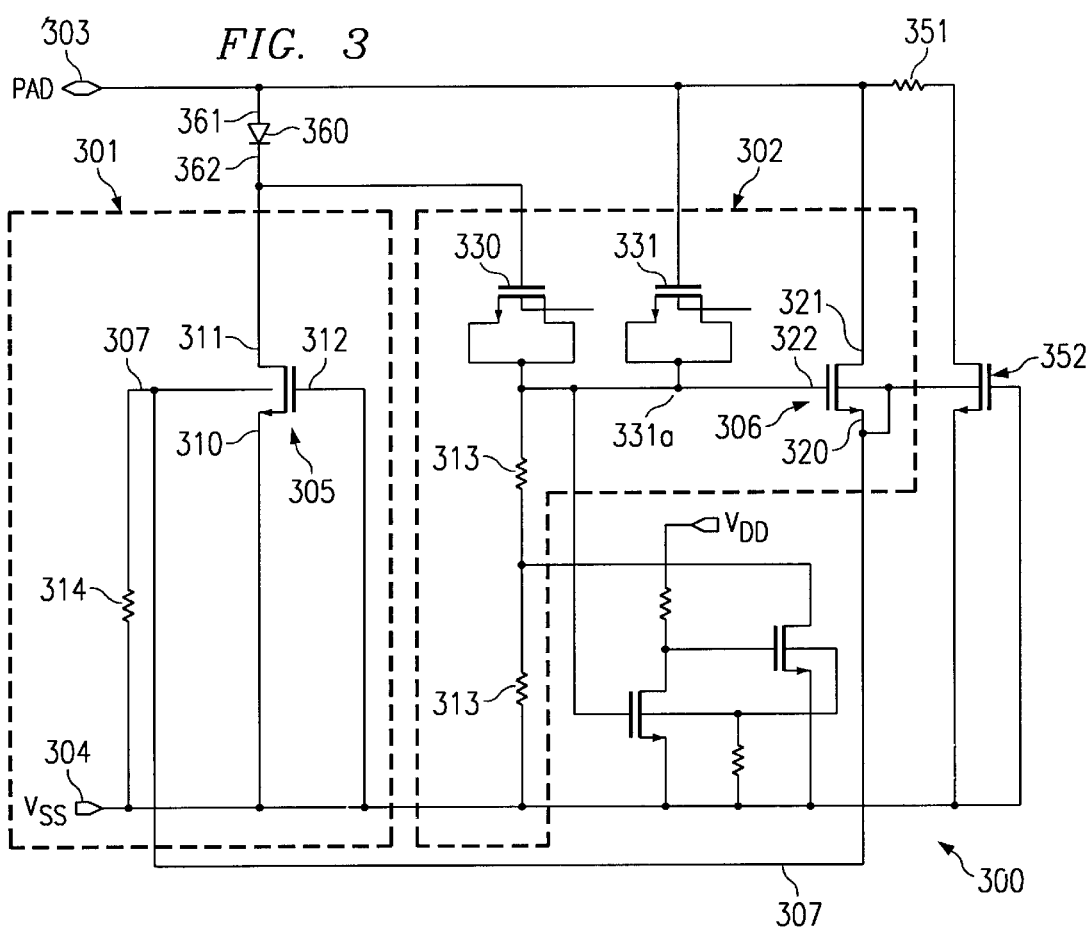
FIG. 3 is a schematic circuit diagram of the fail-safe ESD protection circuit according to the invention.

FIG. 3 shows the integrated circuit, generally designated 300, protecting an I/O or power pad 303 against an ESD pulse, whether of positive or negative polarity, according to the improvements of the invention. The circuit has, in the same substrate, a discharge sub-circuit 301 to ground (Vss, 304) and a substrate bias generator, or drive, sub-circuit 302. The drive sub-circuit uses a portion of the ESD pulse's energy to bias the substrate of the discharge sub-circuit. While the starting material for the device embodiments of the invention is preferably silicon, it may also be silicon germanium, gallium arsenide, or any other semiconductor material used in integrated circuit fabrication. The conductivity of the semiconductor substrate may be p-type or n-type. The p-doping species are selected from a group consisting of boron, aluminum, gallium, and indium. The n-doping species are selected from arsenic, phosphorus, antimony, and bismuth.

Each sub-circuit in FIG. 3 has an MOS transistor. The MOS transistor in discharge sub-circuit 301 is designated 305 and designed as a multi-finger transistor; the MOS transistor in the drive sub-circuit 302 is designated 306.

A forward diode 360 is inserted between I/O pad 303 and drain 311 of transistor 305; the anode 361 of diode 360 is connected to pad 303, and cathode 362 is connected to drain 311. This arrangement insures protection against one polarity of an ESD stress to pad 303 (while protection against the opposite polarity of ESD stress is provided by the pad's direct connection to the drain of transistor 306). The source 310 of transistor 305 is connected to ground 304 (Vss); further, the gates 312 are grounded, since, with substrate bias, the gate coupling is not required for finger-widths with uniform conduction. In addition, the degradation of an onset of second breakdown with gate bias will not be a concern with this gate-grounded approach.

The insertion of diode 360 according to the invention has several benefits:

The junction capacitance of transistor 305 is isolated so that the electrical noise coupling to the substrate is significantly reduced;

the RF/analog signals are much improved; and the leakage current at I/O pad 303 is reduced (by at least an order of magnitude).

In the drive sub-circuit 302, source 320 of transistor 306 is connected to body/substrate 307 and also to ground 304 through substrate resistor 314. The drain 321 of transistor 306 is directly connected to pad 303. As stated above, this connection insures the protection of pad 303 against one polarity of an ESD stress. Gate 322 is connected through resistors 313 to ground 304 and also to capacitors 330 and 331.

It is a feature of the present invention that capacitors 330 and 331 are linear accumulation capacitors. For p-type substrates, these capacitors are n+poly/n-well; for n-type substrates, these capacitors are p+poly/p-well. Capacitors 330 and 331 provide differential booting in order to maintain uniform substrate bias. As pointed out above, uniform substrate bias is essential for instant and simultaneous turn-on of all fingers in a multi-finger transistor. Transistor 305 is thus enabled to act properly as a discharge transistor.

As current conducts to ground through resistor 314, substrate 307 rises to a predetermined maximum voltage. This voltage rise subsequently causes also the substrate 307 of the ESD protection transistor 305 to rise. This rise, in turn, allows all of the multi-finger MOS transistor 305 to turn on as a bipolar device. Discharge sub-circuit 301 the discharges the ESD pulse to ground 304.

The secondary protection circuit ( 351 and 352) is necessary to protect the input CMOS gate for both HBM and CDM, making it an effective fail-safe circuit.

In order to eliminate the non-linear variation of the capacitance as a function of the I/O pad voltage, as displayed in FIG. 2, the invention provides the following feature. A size correlation is established between the junction capacitance of the forward diode 360 (for example, p/n diode), which has a positive voltage coefficient, and the junction capacitances (for example, n/p) of the drive sub-circuit MOS transistor 306 and the secondary protection transistor 352, which have a negative voltage coefficient.

Figure 4:
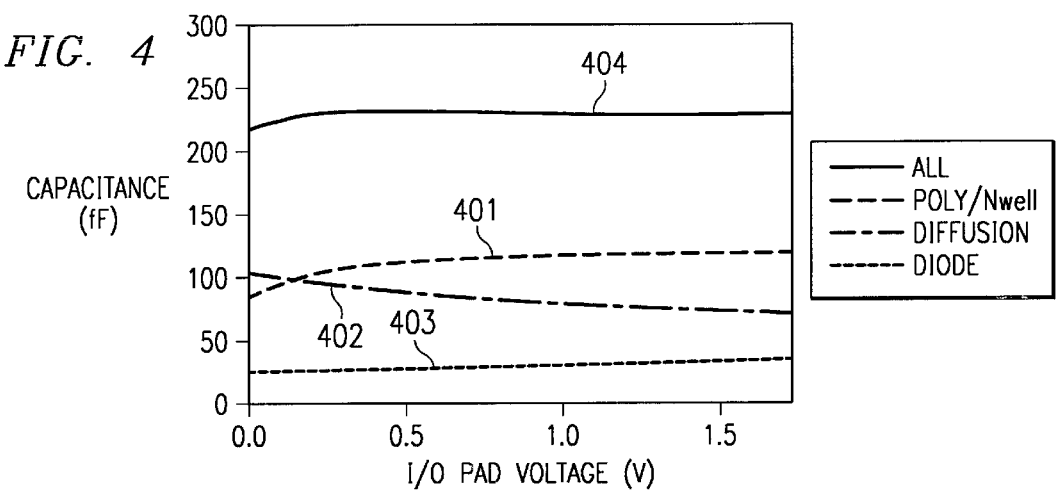
FIG. 4 shows the breakdown of ESD capacitance in the circuit of FIG. 2, illustrating the elimination of the non-linearity and the effective compensation of the voltage dependence.

The favorable result of the design methodologies in FIG. 3 is illustrated in FIG. 4. Plotted is the capacitance (measured in fF) as a function of the I/O pad voltage (measured in V). The biggest parasitic capacitance contributions come from capacitor 331 (for example, poly/n-well) between I/O pad 303 and transistor gate 322 (curve 401) and the junction (diffusion) capacitances of transistors 306 and 352 (curve 402). A relatively minor contribution comes from the capacitance of the diode 360 (curve 403). The overall curve 404 displays the desired linearity and substantially constant value; in the example of FIG. 4, the constancy of the capacitance of the overall ESD protection circuit varies only about 8% across the operating voltage range.

In order to reduce the size of the overall capacitance, one needs to keep in mind that the transistor 306 has to retain the size/width sufficient to generate the substrate current required for uniform turn-on of transistor 305 in an ESD event. Reducing the width of transistor 306 would reduce the drain-to-source pump current during an ESD event and require compensation through a bigger capacitance 331 to increase the voltage at node 331a. Increasing the width of transistor 306, on the other hand, would allow a smaller capacitance 331. A trade-off can lead to a minimum total parasitic capacitance value.

Figure 5A:
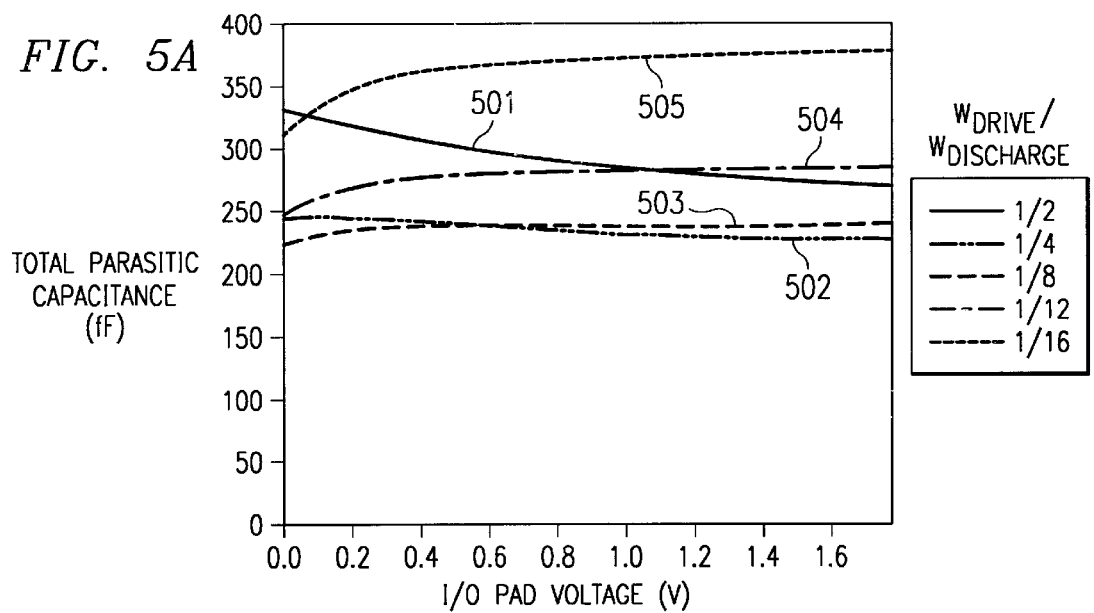
FIG. 5A illustrates a design aspect of the ESD circuit of the invention, resulting in low average ESD capacitance value as well as a substantially constant capacitance value with respect to the I/O pad voltage.

In FIG. 5A, an example is shown where the total parasitic capacitance, measured in fF, is plotted as a function of I/O pad voltage, measured in V. The parameter of the curves is the ratio of the geometrical transistor widths (available to the discretion of the circuit designer), namely the width of the drive transistors 303 and 352, W(drive), to the width of the discharge transistor 305, W(discharge),

| ratio = W(drive)/W(discharge) |
| --- |
| Curve 501 plots the capacitance for the ratio = $\frac{1}{2}$, |
| Curve 502 " " " " " ratio = $\frac{1}{4}$, |
| Curve 503 " " " " " ratio = $\frac{1}{8}$, |
| Curve 504 " " " " " ratio = $\frac{1}{12}$, |
| Curve 505 " " " " " ratio = $\frac{1}{16}$, |

Figure 5B:
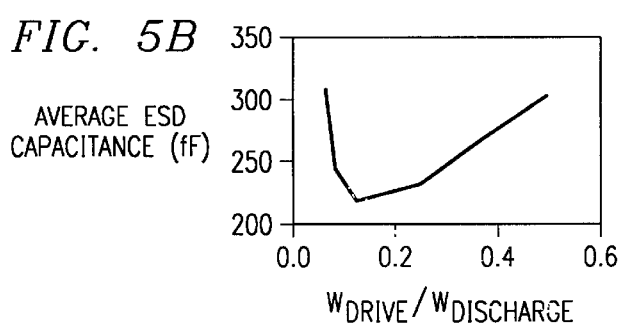
FIG. 5B illustrates the relationship between the average circuit capacitance and the ratio of geometries of the transistors in the drive and the discharge sub-circuits.

In the example of FIG. 5A, a ratio of W(drive)/W(discharge)=1/8 offers the design solution for the smallest total parasitic capacitance; the size of capacitor 331 is to be adjusted to obtain enough voltage at node 331a in an ESD pulse event. This result is summarized in FIG. 5B, which highlights the minimum average capacitance of the ESD protection circuit as a function of the ratio of the geometrical transistor widths.

Figure 6:
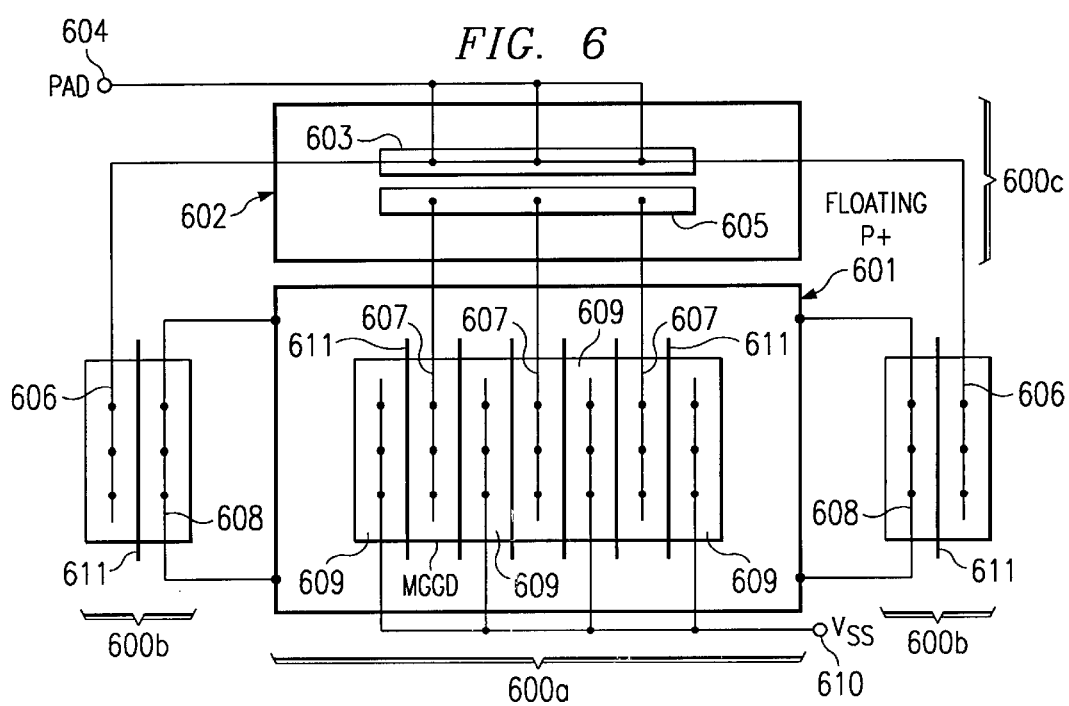
FIG. 6 shows a simplified top view of the MOS transistor of the discharge circuit, the MOS transistor of the drive circuit, and the decoupling diode between the I/O pad and the drive circuit.

FIG. 6 is a simplified top view of an embodiment of the invention. The MOS transistor of the discharge sub-circuit is shown in the discharge circuit 600a, the MOS transistor of the drive sub-circuit in 600b, and the forward diode in 600c. The substrate (not shown in FIG. 6) is of a first conductivity type, for example p-type. The diode 600c is formed in a well of the opposite conductivity type, for example n-well. The anode 603 (in the example, p+) of the diode is connected to the I/O pad 604 and to the drain 606 of the drive transistor 600b, and the cathode 605 (in the example, n+) of the diode is connected to the anode 607 of the discharge transistor 600a. FIG. 6 emphasizes the elongated, finger-like layout of the diode and transistors, and the multi-finger configuration of the transistors. Furthermore, the discharge transistor 600a features a more heavily doped, electrically floating guard ring 601 of the first conductivity type (for example, p+) surrounding the transistor. Guard ring 601 is connected to the source 608 of the drive transistor 600b. The source 609 of discharge transistor 600a is tied to ground 610 (Vss). The electrical connections of the finger-like gates of both transistors are not shown in FIG. 6.

In an actual circuit layout, attention has to be paid to the size of each transistor and the diode, and the ratio of those sizes, because of the relation to the capacitances, as explained above. Furthermore, the placement of the diode 600c relative to the transistors 600a and 600b can play a critical role. Staying with the example of a p-type substrate, the proximity of the vertical pnp from the diode can supply base current for the parasitic npn, making the combination act as a silicon controlled rectifier. It can significantly influence the characteristic of the ESD protection circuit. Using the invention, the ESD protection circuitry is characterized by:

a very small, linear capacitance, making the protection circuitry suitable for linear analog integrated circuits;

good noise immunity, since the ESD circuitry does not pick up noise from the power supply and the noise from ground can be compensated;

fail-safe compatibility, allowing hot insertion, so that the ESD circuitry is a general purpose structure and can be used in all kinds of circuit applications;

suitability for high speed, high precision analog or mixed-signal applications.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

We claim:

1. An integrated circuit protecting an I/O pad against an ESD pulse, said circuit having in the same substrate a discharge sub-circuit and a drive sub-circuit, each sub-circuit including an MOS transistor, comprising:

a direct connection between said I/O pad and the drain of said drive sub-circuit MOS transistor; and a forward diode inserted between said I/O pad and the drain of said discharge sub-circuit MOS transistor to isolate the junction capacitance of said discharge sub-circuit MOS transistor, whereby electrical noise coupling to said substrate is reduced, RF/analog input signals are improved, and leakage at said I/O pad is reduced.

2. The integrated circuit according to claim 1 wherein protection against one polarity of ESD stress is provided by said connection of said I/O pad to said drain of said discharge sub-circuit MOS transistor, and concurrently against the opposite polarity of ESD stress by said connection to the anode of said forward diode.

3. The integrated protection circuit according to claim 1 further comprising:

a size correlation between said forward diode junction capacitance, having a positive voltage coefficient, and said drive sub-circuit MOS transistor junction capacitance, having a negative voltage coefficient, whereby the combined capacitances are substantially constant with respect to said I/O pad voltage.

4. The integrated protection circuit according to claim 1 further comprising:

two accumulation capacitors, one coupled between said I/O pad and said drive circuit MOS transistor the other coupled between said diode and said drive circuit MOS transistor, whereby differential booting is provided to maintain uniform substrate bias.

5. The integrated protection circuit according to claim 1 wherein the material of said substrate is selected from a group consisting of silicon, silicon germanium, gallium arsenide and any other semiconductor material customarily used on semiconductor manufacturing.

6. A protection circuit for protecting a failsafe CMOS integrated circuit in a substrate of a first conductivity type against an ESD pulse at an I/O pad, comprising:

a discharge circuit formed in said substrate, operable to ground said ESD pulse, said circuit comprising a first MOS transistor having source, gate and drain, said source and gate coupled to ground potential;

a forward diode between said I/O pad and said first MOS transistor drain to isolate the junction capacitance of said first MOS transistor, said diode formed in a well of the opposite conductivity type;

a drive circuit operable to use a portion of an ESD pulse voltage to provide a substrate current, and consequently a substrate voltage drop, for allowing said discharge circuit to turn on uniformly and thus to discharge said ESD pulse effectively, said drive circuit including a second MOS transistor having source, gate and drain, said source coupled to said substrate, said drain to said I/O pad, and said gate to an accumulation capacitor, said capacitor biased in the accumulation region to achieve a linear capacitance; and a compensation between the voltage dependences of the parasitic diode junction capacitance, having a positive voltage coefficient, and the second MOS transistor junction capacitance, having a negative voltage coefficient.

7. The circuit according to claims 1 or 6 wherein said pad is an input or a power pad.

8. The circuit according to claims 1 or 6 wherein said MOS transistors are multi-fingered transistors.

9. The circuit according to claims 1 or 6 wherein said diode is a finger-shaped diode.

10. The circuit according to claim 6 wherein said well of opposite conductivity is embedded in a well of first conductivity and separated by trench isolations.

11. The circuit according to claim 6 wherein said first conductivity type is p-type and said MOS transistors are nMOS transistors.

12. The circuit according to claim 6 wherein said first conductivity type is n-type and said MOS transistors are pMOS transistors.

* * * * *